(12) United States Patent
Shen et al.

(10) Patent No.: US 8,337,096 B2
(45) Date of Patent: Dec. 25, 2012

(54) EFFICIENT THERMOELECTRIC COOLING OF PHOTONIC INTEGRATED CIRCUITS

(75) Inventors: Xiao A. Shen, San Bruno, CA (US); Hongbing Lei, Sunnyvale, CA (US); Yu Sheng Bai, Los Altos Hills, CA (US)

(73) Assignee: Futurewei Technologies, Inc., Plano, TX (US)

( * ) Notice: Subject to any disclaimer, the term of this patent is extended or adjusted under 35 U.S.C. 154(b) by 377 days.

(21) Appl. No.: 12/627,255

(22) Filed: Nov. 30, 2009

(65) Prior Publication Data

US 2011/0129192 A1 Jun. 2, 2011

(51) Int. Cl.
G02B 6/26 (2006.01)
G02B 6/36 (2006.01)
H01S 3/04 (2006.01)
H04B 10/04 (2006.01)

(52) U.S. Cl. ............... 385/89; 385/37; 372/34; 398/87; 398/139; 398/200

(58) Field of Classification Search ............ 385/89; 372/34

See application file for complete search history.

(56) References Cited

U.S. PATENT DOCUMENTS

| | | | |
|---|---|---|---|
| 7,585,117 B2 | 9/2009 | Kaneko et al. | |
| 2006/0182441 A1* | 8/2006 | Kish et al. | 398/33 |
| 2008/0080864 A1 | 4/2008 | Bai | |
| 2008/0187268 A1 | 8/2008 | Kaneko et al. | |
| 2009/0252188 A1 | 10/2009 | Rossi et al. | |

FOREIGN PATENT DOCUMENTS

| | | |
|---|---|---|
| CN | 201113221 Y | 9/2008 |
| CN | 101286619 A | 10/2008 |

OTHER PUBLICATIONS

Foreign Communication From a Related Counterpart Application, PCT Application PCT/CN2010/078501, International Search Report dated Feb. 10, 2011, 5 pages.
Foreign Communication From a Related Counterpart Application, PCT Application PCT/CN2010/078501, Written Opinion dated Feb. 10, 2011, 7 pages.
Hashimoto, Toshikazu, et al., "Hybrid Integration of Spot-Size Converted Laser Diode on Planar Lightwave Circuit Platform by Passive Alignment Technique," IEEE Photonics Technology Letters, vol. 8, No. 11, Nov. 1996, pp. 1504-1506.

(Continued)

*Primary Examiner* — Jerry Rahll
(74) *Attorney, Agent, or Firm* — Conley Rose, P.C.; Grant Rodolph

(57) ABSTRACT

An apparatus comprising a carrier comprising at least one heat-generating component and a thermoelectric cooler (TEC) coupled to a surface of the carrier, wherein the cross-sectional area of the TEC is less than the cross-sectional area of the carrier, and wherein the TEC is aligned with the heat-generating component. Included is an apparatus comprising a carrier comprising a plurality of optical transmitters and an active component, at least one TEC coupled to the surface of the carrier, and a support post coupled to the surface of the carrier, wherein the support post has a higher thermal resistivity than the TEC, wherein the cross-sectional area of the TEC is less than the cross-sectional area of the carrier, and wherein the TEC is aligned with the optical transmitters, the active component, or both.

20 Claims, 4 Drawing Sheets

OTHER PUBLICATIONS

Hashimoto, Toshikazu, et al., "Multichip Optical Hybrid Integration Technique with Planar Lightwave Circuit Platform," Journal of Lightwave Technology, vol. 16, No. 7, Jul. 1998, pp. 1249-1258.

Henry, C.H., et al., "Glass Waveguides on Silicon for Hybrid Optical Packaging," Journal of Lightwave Technology, vol. 7, No. 10, Oct. 1989, pp. 1530-1539.

Ketelsen, L. J. P., et al., "Multiwavelength DFB Laser Array with Integrated Spot Size Converters," IEEE Journal of Quantum Electronics, vol. 36, No. 6, Jun. 2000, pp. 641-648.

Koch, T. L., et al., "Tapered Waveguide InGaAs/InGaAsP Multiple-Quantum-Well Lasers," IEEE Photonics Technology Letters, vol. 2, No. 2, Feb. 1990, pp. 88-90.

Lealman, I. F., et al., "1.56µm InGaAsP/InP Tapered Active Layer Multiquantum Well Laser with Improved Coupling to Cleaved Singlemode Fibre," Electronics Letters, vol. 30, No. 11, May 26, 1994, pp. 857-859.

Mino, S., et al., "Planar Lightwave Circuit Platform with Coplanar Waveguide for Opto-Electronic Hybrid Integration," Journal of Lightwave Technology, vol. 13, No. 12, Dec. 1995, pp. 2320-2326.

Nagarajan, Radhakrishnan, et al., "Large-Scale Photonic Integrated Circuits," IEEE Journal of Selected Topics in Quantum Electronics, vol. 11, No. 1, Jan./Feb. 2005, pp. 50-65.

Ogawa, Ikuo, et al., "Reduction of Waveguide Facet Reflection in Optical Hybrid Integrated Circuit Using Saw-Toothed Angled Facet," IEEE Photonics Technology Letters, vol. 7, No. 1, Jan. 1995, pp. 44-46.

Tohmori, Y., et al., "Spot-Size Converted 1.3µm Laser with Butt-Jointed Selectively Grown Vertically Tapered Waveguide,", Electronics Letters, vol. 31, No. 13, Jun. 22, 1995, pp. 1069-1070.

Thermoelectric Cooler, DT3-2.5, Product Information, Marlow Industries Inc., 102-0162, Rev. C, 2 pages, Dec. 2000.

* cited by examiner

EFFICIENT THERMOELECTRIC COOLING OF PHOTONIC INTEGRATED CIRCUITS

CROSS-REFERENCE TO RELATED APPLICATIONS

Not applicable.

STATEMENT REGARDING FEDERALLY SPONSORED RESEARCH OR DEVELOPMENT

Not applicable.

REFERENCE TO A MICROFICHE APPENDIX

Not applicable.

BACKGROUND

Photonic integrated circuits (PICs) may comprise an array of semiconductor lasers as optical transmitter sources. The performance of a PIC requires signal integrity from the laser sources. Output signals from the laser arrays may vary due to manufacturing process variations, device age, device temperature, or other internal or external factors. Operating the laser arrays may generate heat that affects the operation of the lasers, and may also affect other components of the PIC. Also, the laser arrays may comprise individual heaters for the lasers to adjust or tune laser wavelength output. This tuning may add additional heat to the PIC. Thermal management of this added heat may improve signal integrity of the output signals from the PICs. One approach to thermal management has been to use thermoelectric coolers (TEC) to remove heat from the PICs. However, TECs may consume a substantial amount of power, which causes further difficulties for managing power consumption of the PICs.

SUMMARY

In an embodiment, the disclosure includes an apparatus comprising a carrier comprising at least one heat-generating component and a TEC coupled to a surface of the carrier, wherein the cross-sectional area of the TEC is less than the cross-sectional area of the carrier, and wherein the TEC is aligned with the heat-generating component.

In another embodiment, the disclosure includes an apparatus comprising a carrier comprising a plurality of optical transmitters and an active component, at least one TEC coupled to the surface of the carrier, and a support post coupled to the surface of the carrier, wherein the support post has a higher thermal resistivity than the TEC, wherein the cross-sectional area of the TEC is less than the cross-sectional area of the carrier, and wherein the TEC is aligned with the optical transmitters, the active component, or both.

These and other features will be more clearly understood from the following detailed description taken in conjunction with the accompanying drawings and claims.

BRIEF DESCRIPTION OF THE DRAWINGS

For a more complete understanding of this disclosure, reference is now made to the following brief description, taken in connection with the accompanying drawings and detailed description, wherein like reference numerals represent like parts.

DETAILED DESCRIPTION

Figure 1:
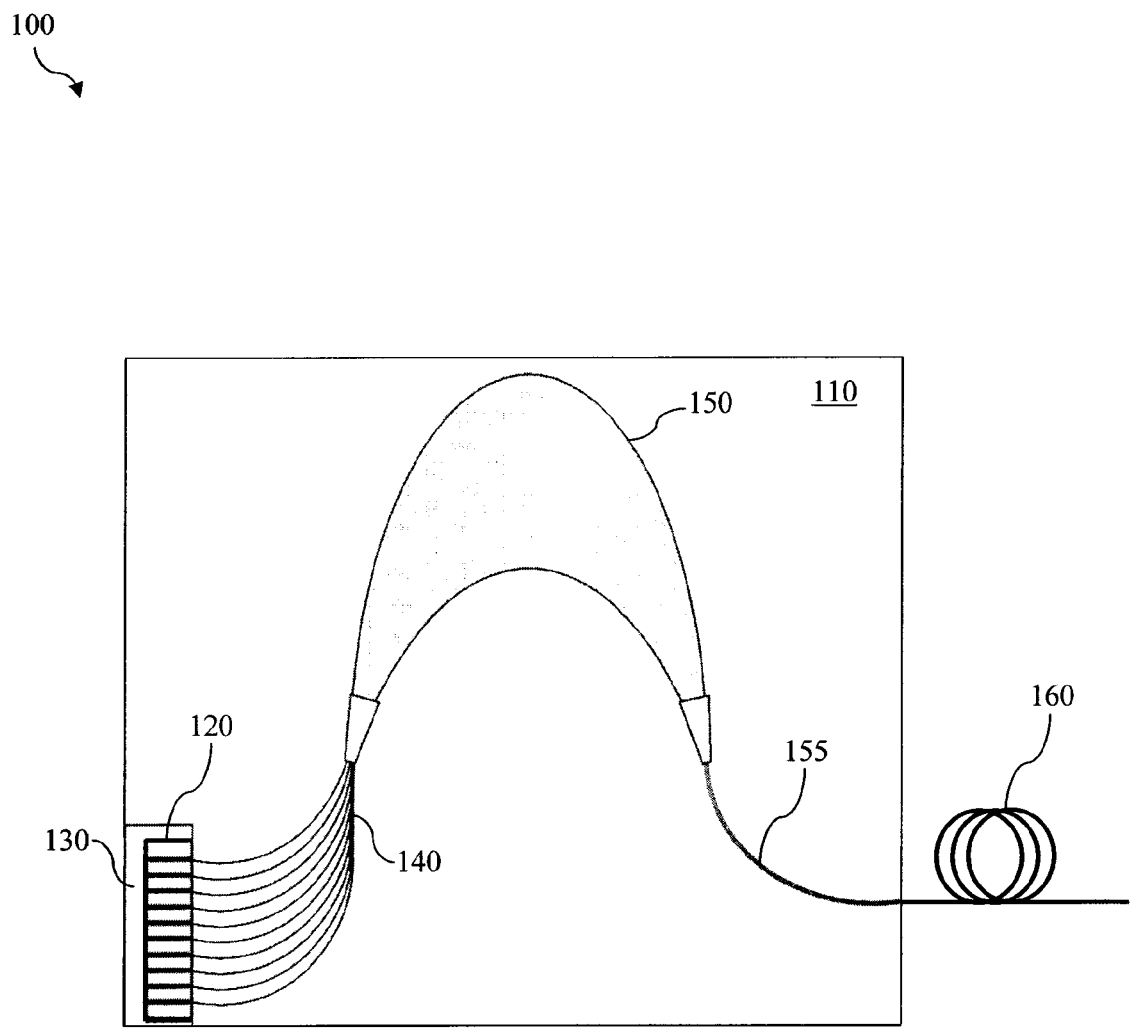
FIG. 1 is a top plan view of an embodiment of a wavelength division multiplexing (WDM) transmitter.

It should be understood at the outset that, although an illustrative implementation of one or more embodiments are provided below, the disclosed systems and/or methods may be implemented using any number of techniques, whether currently known or in existence. The disclosure should in no way be limited to the illustrative implementations, drawings, and techniques illustrated below, including the exemplary designs and implementations illustrated and described herein, but may be modified within the scope of the appended claims along with their full scope of equivalents.

Integrated WDM transmitters may be attractive devices for data transport systems. Technologies for making these transmitters, such as monolithic and hybrid integration, have been developed and show potential for lowering cost and power consumption per gigahertz (GHz) bandwidth, e.g. in comparison to discrete WDM transmitters. In monolithic integration, multiple WDM components may be integrated together with an arrayed waveguide (AWG) multiplexer to form a WDM transmitter array with a single optical output. This level of integration may be accomplished on a monolithic indium phosphide (InP) chip which may have an area equal to about four millimeters (mm) by about five mm and may be substantially less than a similar device comprising discrete components. In general, power consumption may be improved as the laser density is increased. More lasers can share a TEC to achieve operation at an optimal temperature, e.g. at about twenty degrees Celsius. In addition, the laser integration may also increase port density. Hybrid integration also shares some of the advantages of monolithic integration, e.g. high port density, low power consumption, and low cost for volume production. However, hybrid integration has unique advantages over the monolithic integration, such as having higher manufacturing yield. Since monolithic integration relies on InP technologies, which have not yet reached full maturity, device yield for single WDM laser chips may be low using monolithic integration. For example, integration of multiple elements (e.g. greater than forty elements) on a single chip using the monolithic approach can produce yields of only about a single digit. Hybrid integration, on the other hand, uses more mature technologies for each component and as a result the yield may be substantially higher.

One key challenge for making monolithic or hybrid integration technologies practical for WDM applications may be improving the tunability for each individual laser in the transmitter array so that the all channels can be aligned to the International Telecommunications Union (ITU) grid simultaneously. Specifically, the temperature of the active components, such as the lasers, needs to be precisely controlled, e.g. by the TECs. However, the temperature of the passive components, such as fibers, couplers, and wavelength multiplexers, does not need to be as precisely controlled because they are less sensitive to temperature variation. Currently, temperature control of the active components is accomplished thermally by coupling heaters into the laser array to vary the local temperature of each laser. This added heat provides adjustments to the output wavelength of the lasers. Unfortunately, thermally adjusting the laser wavelength also introduces additional unwanted heat, which may complicate thermal management of the system. For example, an array of about four lasers may require a total cooling power of about one watt. However, an array of about four lasers with the addition of local heaters to provide a tunability range of about one hundred GHz in each laser may require a total cooling power on the order of about three watts, which is about three times higher than without using the heaters.

Thermal management is further complicated because integration often includes an AWG or other component that may occupy a substantial portion of the system area. For example, a 200 GHz spaced AWG with an index difference of about 1.5 percent may require a chip size that is about ten times larger than without using an AWG. As the AWG is an integral part of the device, this area is often cooled by the TEC along with the laser arrays which may increase power consumption in the system. Other issues, such as thermal crosstalk between lasers, may further complicate the cooling of integrated transmitters. To reduce thermal crosstalk, more heat may be added to the lasers by the heaters in order to achieve a comparable thermal tuning range. For example, in a case where a laser's nearest neighbor introduces thermal crosstalk of about ten percent, an additional heat input from the heaters of about twenty percent may be needed to maintain an adequate tuning range.

Disclosed herein is an apparatus and method that provide thermal management of a PIC. The PIC may comprise a TEC coupled to a carrier, which may be used for cooling some of the components of the carrier. Efficient thermal management of the PIC may be achieved through appropriate selection of size and location of the TEC. An appropriate TEC size may be the smallest TEC that may provide sufficient cooling without reaching a threshold for high thermal resistivity. For instance, a TEC that is too small for a particular application may provide high thermal resistivity due to insufficient thermal coupling between the TEC and the carrier. On the other hand, a TEC that is larger than needed may provide cooling in areas where it may not be needed, thereby resulting in wasting power for unnecessary cooling. In addition, the appropriate positioning of the TEC for component cooling may further improve thermal management of the PIC. For instance, positioning a TEC in proximity to a source of heat in the carrier may provide efficient heat removal without cooling passive components and/or without relying on thermal conduction to channel heat from active components to achieve cooling. In a variety of embodiments, any size, shape, or quantity of TECs may be coupled to a carrier to provide efficient thermal management.

The laser transmitter system may comprise a plurality of optical transmitters, such as lasers, photodiodes, other devices configured to transmit electromagnetic waves at optical wavelengths, or combinations thereof. The optical wavelengths may comprise at least a portion of the visible wavelength range, infrared wavelength range, ultraviolet (UV) wavelength range, or other optical wavelength ranges. In an embodiment, the optical transmitters may be discrete transmitter units, which may be coupled to one another. For example, the discrete optical transmitters may be mounted in an array arrangement on a carrier, or an optical platform. The optical transmitters may also be coupled to an optical coupler or a wavelength multiplexer, which may be configured to combine the outputs from the different optical transmitters into a single output. The outputs from the different optical transmitters may have different wavelengths and the output from the optical coupler or wavelength multiplexer may comprise the different wavelengths of the optical transmitters. The optical coupler may be positioned on a carrier. The optical coupler may be coupled to the optical transmitters via a plurality of fibers or waveguides, and may also be coupled to an output via an additional fiber or waveguide. Additionally, the laser transmitter system may comprise a wavelength locking apparatus, which may be coupled to the optical transmitters and the optical coupler. In an alternative embodiment, at least some of the passive components of the laser transmitter system may be integrated into a chip, such as a planar lightwave circuit (PLC) and the PLC may be used as a carrier on which active components like lasers may be placed.

FIG. 1 illustrates an embodiment of a WDM laser transmitter 100, such as a PIC. The WDM laser transmitter 100 may comprise a carrier 110, a laser dice 120, a step 130, a plurality of first channels 140, an arrayed waveguide (AWG) 150, and optionally a second channel 155. The WDM laser transmitter 100 may also comprise or may be coupled to a fiber 160. These components may be configured according to known configurations, such as a hybrid integration configuration or a monolithic configuration. The WDM laser transmitter 100 may emit a plurality of distinct Dense WDM (DWDM) channels, as described in the International Telecommunication Union Telecommunication Standardization Sector (ITU-T) G.694.1, and/or coarse WDM (CWDM) channels, as described in the ITU-T G.694.2. As such, the WDM laser transmitter 100 may be suitable for use in backbone and/or access optical networks.

In an embodiment, the carrier 110 may be configured to accommodate and integrate the several components. Specifically, the carrier 110 may comprise at least one material that integrates, bonds, and/or supports at least some of the active and/or passive components of the WDM laser transmitter 100, such as the laser dice 120, the first channels 140, the AWG 150, and/or the second channel 155. The carrier 110 may be produced using a deposition process, for instance on a chip or substrate. Further, the carrier 110 may comprise a plurality of layers at different sites, which may be produced using deposition and/or etching. The layers may bind together other components of the WDM transmitter 100, such as the first channels 140, the AWG 150, and/or the second channel 155. Additionally, the layers may mount or support a component of the WDM laser transmitter 100, such as the laser dice 120. In an embodiment, the carrier 110 may comprise a thin film layer of a dielectric material, such as silicon dioxide ($SiO_2$), which may be deposited on a substrate using chemical deposition, such as chemical solution deposition (CSD), chemical vapor deposition (CVD), and plasma-enhanced CVD (PECVD). Alternatively, the film layer may be deposited using physical deposition, such as thermal evaporation, sputtering, pulsed laser deposition, or cathodic arc deposition (arc-PVD). Other deposition processes also may be used, including reactive sputtering, molecular beam epitaxy (MBE), metalorganic vapor phase epitaxy (MOVPE), topotaxy, or any other suitable process. The thin film layer also may be etched at some regions of the carrier 110 using wet chemical etching or dry plasma etching. The thin film layer may have a thickness less than about one mm, such as about ten micrometers.

The laser dice 120 may be the light emitting components of the WDM laser transmitter 100. The laser dice 120 may be coupled to the carrier 110 and comprise a plurality of integrated semiconductor lasers, which may be configured in an array. For instance, an array of semiconductor lasers may be produced by depositing a lasing material, such as indium phosphide (InP) or gallium arsenide (GaAs), at a plurality of aligned sites on a chip. Alternatively, the lasing material may be added to the chip using chemical or electrochemical doping. The laser dice 120 may be laser diodes, heterostructure lasers, quantum well lasers, quantum cascade lasers, distributed feedback (DFB) lasers, combinations thereof, or other. The laser dice 120 may be configured to transmit a plurality of light waves substantially in the same direction, e.g., from the same side of the array. The laser dice 120 also may be configured to transmit the light waves at a plurality of wavelengths that span a bandwidth. In an embodiment, the wavelengths may be spaced by about the same value, where the difference between the values of any two wavelengths may be about the same. In an embodiment, the laser dice 120 may be coupled to the carrier 110 via bonding.

In an embodiment, the laser dice 120 may be accommodated by the step 130 and the carrier 110. For instance, the step 130 may be positioned at one edge of the carrier 110 and coupled to the laser dice 120. The step 130 may comprise a layer of the carrier 110, which may be produced via etching or deposition, and as such may comprise the same material as the carrier 110, e.g. $SiO_2$. The step 130 also may be coupled to external electrical components, which may be used to operate and/or modulate the WDM laser transmitter 100, as described below.

The light emitted from the laser dice 120 may be transported to other components of the WDM laser transmitter 100 via the first channels 140. As such, the first channels 140 may be coupled to the laser dice 120 and the AWG 150 and may be aligned with the laser dice 120. The first channels 140 may comprise a plurality of waveguides, which may be configured to transfer the light from the laser dice 120 to the AWG 150. The waveguides may be dielectric waveguides, which may comprise a dielectric material that has a higher permittivity or dielectric constant than the surrounding carrier 110, which may be a PLC. For example, the first channels 140 may be produced by depositing a layer of higher index material on the carrier 110, etching the surrounding areas, and then depositing the same material as the carrier 110 until the deposited material forms the upper cladding. Such a process may produce the same cladding material all around the channels 140. Thus, the light waves may be guided through the first channels 140 by total internal reflection from the laser dice 120 to the AWG 150.

The light waves transported by the first channels 140 may be combined into a single light wave at the AWG 150, and hence transmitted from the WDM laser transmitter 100. Accordingly, the AWG 150 may be coupled to the first channels 140 and the second channel 155. The AWG 150 may be an optical multiplex (MUX) configured to combine a plurality of light waves from the first channels 140 into a combined light wave that propagates in the second channel 155. For instance, the AWG 150 may comprise a plurality of grating waveguides, which may have different lengths, where each two adjacent grating waveguides may have about the same length difference. The light waves may correspond to the individual semiconductor lasers in the laser dice 120, where each light wave may have a different wavelength. The light waves may propagate through the grating waveguides, undergo a change of phase due to the length difference between the adjacent grating waveguides, and constructively interfere into the combined light wave at an output of the AWG 150. Hence, the combined light wave may comprise all the wavelengths of the individual light waves. The grating waveguides may be dielectric gratings waveguides, which may comprise the same material as the first channels 140, and may be produced using a process similar to the process used to produce the first channels 140.

The combined light may be transmitted from the WDM laser transmitter 100 using the second channel 155 and the fiber 160. The second channel 155 may comprise a dielectric waveguide, similar to the first channels 140. The second channel 155 may be coupled to the AWG 150 and the fiber 160, and as such may guide the combined light from the AWG 150 to the fiber 160. The second channel 155 may be produced using a process similar to the process used to produce the first channels 140. In an embodiment, the first channels 140, the AWG 150, and the second channel 155 may be positioned in the same layer of the carrier 110 and may be aligned with the laser dice 120.

In an embodiment, the fiber 160 may be an optical fiber, which may be used to transport the combined light wave from the WDM laser transmitter 100 to an optical system, such as an optical telecommunications system or an optical network. Specifically, the fiber 160 may be used to transport WDM signals, such as the DWDM and/or CWDM signals described above. The fiber 160 may be a standard single mode fibers (SMFs) as defined in ITU-T standard G.652, dispersion shifted SMF as defined in ITU-T standard G.653, cut-off shifted SMF as defined in ITU-T standard G.654, non-zero dispersion shifted SMF as defined in ITU-T standard G.655, wideband non-zero dispersion shifted SMF as defined in ITU-T standard G.656, multimodal fiber, or any other type of fiber. All of the standards described herein are incorporated herein by reference.

Figure 2A:
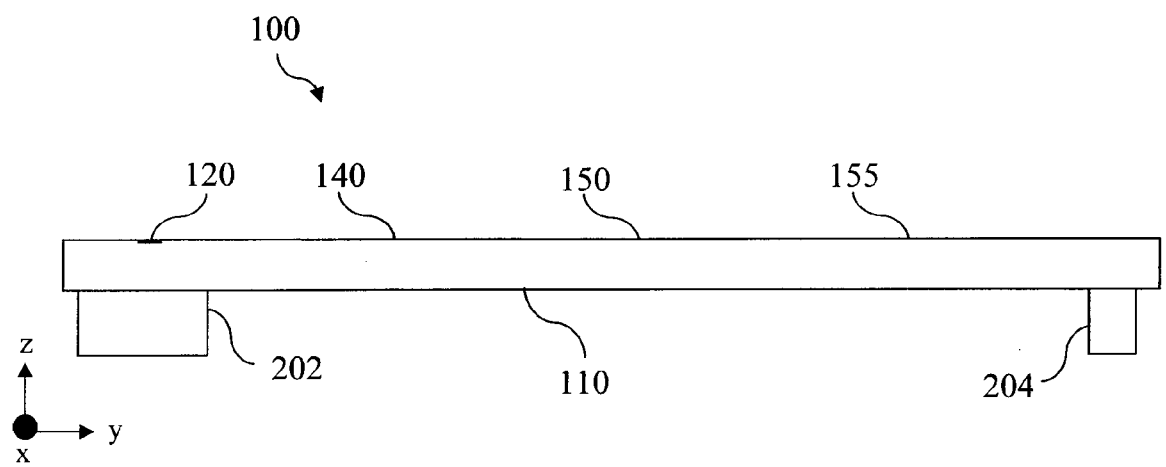
FIG. 2A is a side elevation view of an embodiment of the WDM transmitter.

FIG. 2A illustrates a side view of the WDM laser transmitter 100. It will be appreciated that the components of the WDM laser transmitter 100 may be integrated into the carrier 110, and thus may not be visible in a side view. Likewise, a section view of the WDM laser transmitter 100 may fail to show the location of all of the components of the WDM laser transmitter 100. As such, the location of several of the components of the WDM laser transmitter 100 are shown in FIG. 2A as lines on the upper surface of the carrier 110, with the understanding that though these component may appear to be on the surface of the carrier 110, they may in fact be embedded within the carrier 110 such that they do not extend from the surface, as is the case when the carrier 110 is a PLC. The components of the WDM laser transmitter 100 that are shown include the carrier 110, the laser dice 120, the first channel 140, the AWG 150, and the second channel 155. Additionally, the carrier 110 may be coupled to a TEC 202 and a support post 204. The TEC 202 and the support post 204 may be coupled to opposite ends of the bottom of the carrier 110 on the opposite side of the remaining components. Further, the first channel 140 and the AWG 150 may be components of a MUX. In some embodiments, the second channel 155 may also be a component of the MUX.

The carrier 110 may be a portion of a semiconductor wafer, such as a Silicon (Si) substrate used in the fabrication of integrated circuits and microelectronics. For instance, the carrier 110 may comprise substantially pure and defect free crystalline material, e.g. crystalline Si. The carrier 110 may be produced using a crystal growth process, such as the Czochralski process. The carrier 110 may then be sliced using, for instance, a diamond coated blade, and polished by one or more of a variety of processes, such as lapping, chemical mechanical polishing, or other polishing process. The carrier 110 may be formed by sawing or otherwise machining the material of the carrier 110 into a shape. The carrier 110 may be tabular, rectangular, or disk shaped. For example, the carrier 110 may have a length, width, or diameter from about one inch to about 12 inches, and may have a thickness less than about one mm and greater than about 100 μm.

The TEC 202 may be configured to provide cooling to at least some of the components of the carrier 110, such as the laser dice 120. For instance, the TEC 202 may comprise a plurality of high thermally conductive units that may be aligned in an array along the length of the TEC 202 and across the carrier 110. The high thermally conductive units, also referred to as pellets, junctions, or couples, may be about equally spaced from each other and may be coupled to the carrier 110. In an embodiment, the couples may be bimetallic couples between two dissimilar metal surfaces, (e.g. bismuth and tellurium), which may conduct heat in a specific direction, based on the direction of flow of a current passing through the couples. Specifically, the current may be directed to transfer heat from the carrier 110 to the TEC 202. The couples may be arranged in parallel, e.g. side-by-side, to provide a larger cross-sectional area for heat flow. The power consumption of the TEC 202 may be given by $P=Ni^2r$, where P is the power, i is the drive current of the TEC 202, r is the resistance of the TEC 202, and N is the number of couples of the TEC 202. As the number of couples N of the TEC 202 decreases, e.g. below a certain threshold value, the thermal resistance of the TEC 202 may increase. In embodiments, the TEC 202 may be sized according to the thermal load imposed by at least some of the heat generating components of the carrier 110. As such, the cross-sectional area of the TEC 202 (e.g. the upper surface that is coupled to the carrier 110) may be less than the cross-sectional area of the carrier 110 (e.g. the lower surface that is coupled to the TEC 202 and the support post 204). As used herein, the term "cross-sectional area" may refer to the area of a surface coupled to the surface of another component. For example, the cross-sectional area of the TEC may be the area of the surface of the TEC that is coupled to the carrier (e.g. the upper surface of the TEC as shown in FIG. 2A). Similarly, the cross-sectional area of the carrier may be the area of the surface of the carrier that is coupled to the TEC (e.g. the lower surface of the carrier as shown in FIG. 2A). In embodiments, the cross-sectional area of the TEC 202 coupled to the carrier 110 may be less than 70%, less than 50%, less than 40%, less than 30%, less than 20%, or less than 10% of the cross-sectional area of the carrier 110. As shown in FIG. 2A, the TEC 202 may be less than the length (e.g. in the y direction) of the carrier 110. Specifically, the length of the TEC 202 may be about equal to the length of the laser dice 120 to provide sufficient cooling to the laser dice 120 without increasing unnecessarily the overall power consumption. Therefore, the dimensions of the TEC 202 may be appropriately configured, taking into account such effects. Selecting the proper size of the TEC 202 may comprise determining a size at which effective heat removal may be reached, without consuming more power than needed in managing the heat load.

The support post 204 may comprise any of a plurality of materials, such as stainless steel, Si, $SiO_2$, ceramic, or other suitable material that may have relatively low thermal conductivity. For instance, the support post 204 may have lower thermal conductivity or higher thermal resistivity than the TEC 202. The support post 204 may be cylindrical, tubular, rectangular, or other suitable shape that may have sufficient mechanical strength to provide mechanical support for the WDM laser transmitter 100. In an embodiment, the support post 204 may be hollow to further reduce its thermal conductivity. The support post 204 may have about the same height (e.g. in the z direction) as the TEC 202. The support post 204 may provide support to the carrier 110 along with the TEC 202. For example, height of the support post 204 may be from about two mm to about ten mm. The support post 204 may be attached to the carrier 110 and may be arranged to support a portion of the carrier 110 that is not supported by the TEC 202 or any other supporting component or structure. As shown in FIG. 2A, the support post 204 may be positioned at the opposite end of the carrier 110 from the TEC 202 (e.g. in the y direction). In another embodiment, a second support post 204 may be positioned in the middle of the carrier 110, to provide additional support to the WDM laser transmitter 100.

In an embodiment, the laser dice 120 may be an active component that may be a source of heat. As such, the size of the TEC 202 may be sufficient to remove the excess heat of the laser dice 120 and to provide sufficient cooling without excessive power consumption. In an embodiment, the size of the TEC 202 may be less than, greater than, or the same as any component of the carrier 110 that may need cooling, e.g. the laser dice 120 and/or any heaters. For instance, the TEC 202 may be aligned with the laser dice 120 on the bottom of the carrier 110 and on the opposite side of the laser dice 120. As such, the TEC 202 may draw heat from the laser dice 120 and promote operation of the laser dice 120 at an appropriate temperature, such as about twenty degrees Celsius.

In an embodiment, any heat generated from the operation of the laser dice 120 or, for example, added to the laser dice 120 by a plurality of heaters (not shown), may be transferred through the carrier 110 to the TEC 202 via thermal conduction. The TEC 202 may provide heat pumping (e.g. based on the Peltier effect) to transfer the heat of the laser dice 120 from the bottom side of the carrier 110 to the bottom of the TEC 202. The heat may then be transferred away from the bottom of the TEC 202 by conduction, convection, radiation, or other means of heat transfer to another component, to air, or another location away from the WDM laser transmitter 100. As such, the heat of the WDM laser transmitter 100 may be thermally managed. In addition, appropriately sizing the TEC 202 may minimize the power consumption of the TEC 202. For instance, increasing the size of the TEC 202 beyond a threshold needed for sufficient cooling may increase unnecessarily the power consumption of the TEC 202. Also, if the TEC 202 is larger than required, it may cool components of the carrier 110 that do not generate heat, and may thereby waste power. Further, positioning and aligning the TEC 202 in proximity to the source of heat, e.g. the laser dice 120 and/or any heaters, may reduce any effects that other components of the carrier 110 may experience due to any generated heat or cooling effects of the TEC 202.

Figure 2B:
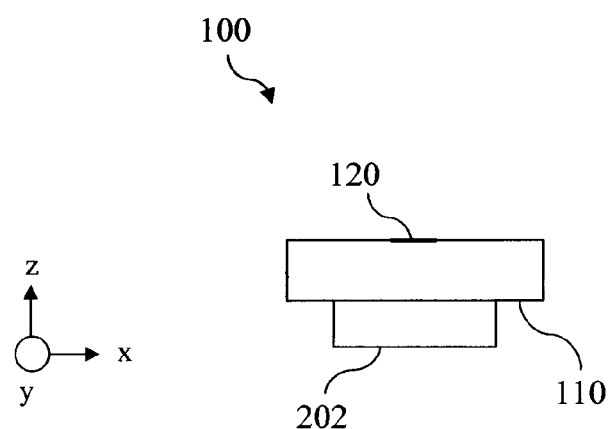
FIG. 2B is a rear elevation view of the WDM transmitter.

FIG. 2B illustrates a rear view of the WDM laser transmitter 100. Similar to FIG. 2A, the location of several of the components of the WDM laser transmitter 100 are shown in FIG. 2B as lines on the upper surface of the carrier 110, with the understanding that though these component may appear to be extending from the surface of the carrier 110, they may in fact be embedded within the carrier 110 such that they do not extend from the surface. The components of the carrier 110 that are shown include the carrier 110, the laser dice 120, and the TEC 202. As shown in FIG. 2B, the TEC 202 may be less than the width (e.g. in the x direction) of the carrier 110. Specifically, the width of the TEC 202 may be about equal to the width of the laser dice 120 to provide sufficient cooling to the laser dice 120 without increasing unnecessarily the overall power consumption. The dimensions of the TEC 202 (e.g. in the x, y, and/or z direction) may be chosen to provide improved thermal management and functionality of the WDM laser transmitter 100, without excessive power consumption.

Figure 3A:
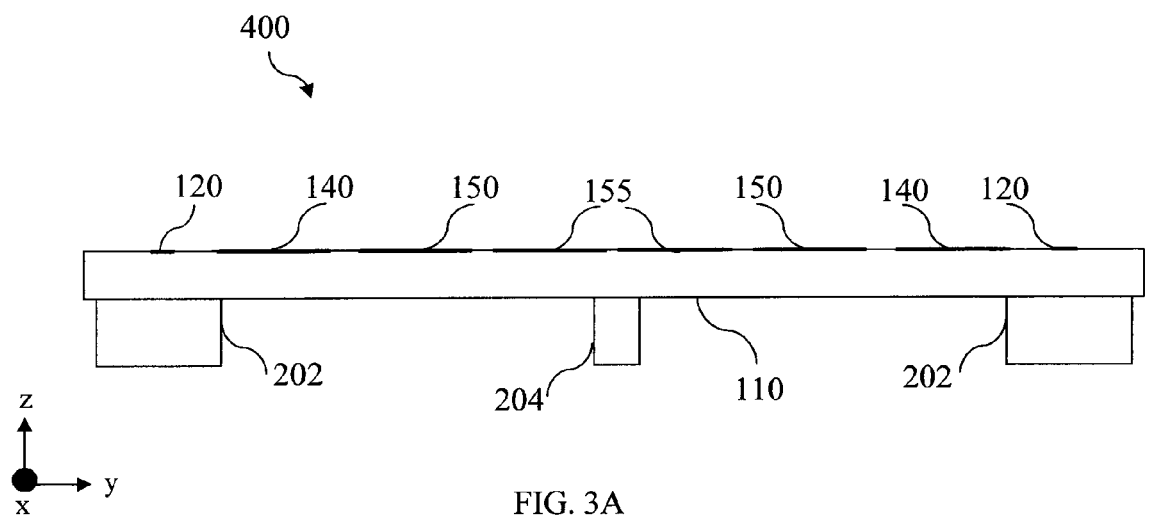
FIG. 3A is a side elevation view another embodiment of the WDM transmitter comprising two TECs.

FIG. 3A illustrates another embodiment of a WDM laser transmitter 400. Similar to FIG. 2A, the location of several of the components of the WDM laser transmitter 400 are shown in FIG. 3A as lines on the upper surface of the carrier 110, with the understanding that though these component may appear to be extending from the surface of the carrier 110, they may in fact be embedded within the carrier 110 such that they do not extend from the surface. These components include a plurality of laser dice 120, first channels 140, AWGs 150, and second channels 155, which may be configured similarly to the corresponding components of the WDM transmitter 100. For instance, two laser dice 120, two first channels 140, two AWGs 150, and two second channels 155 may be located on opposite edges of the carrier 110, e.g. in a mirror image type of arrangement. Alternatively, two laser dice 120 and two first channels 140 may be located on opposite edges of the carrier 110 and coupled to a single AWG 150 and a single second channel 155. In either case, two separate TECs 202 may be positioned beneath each of the two laser dice 120 and/or heaters, and may be configured to remove heat from the corresponding two laser dice 120. In addition, a support post 204 may be positioned between the two TECs 202 to support the middle portion of the WDM transmitter 400. As described above, the TECs 202 may facilitate heat removal from the two laser dice 120 to provide thermal management of the WDM transmitter 400. Additionally, using the two separate TECs 202 may result in lower power consumption in comparison to a single TEC that has about the same cross-sectional area as the carrier 110. The total area of the two separate TECs 202 may be less than the total area of a single TEC 202 that covers an area including the two laser dice 120 at opposite edges of the carrier 110. The reduction in area achieved using two TECs instead of a single TEC may reduce unnecessary power consumption to operate the TEC.

Figure 3B:
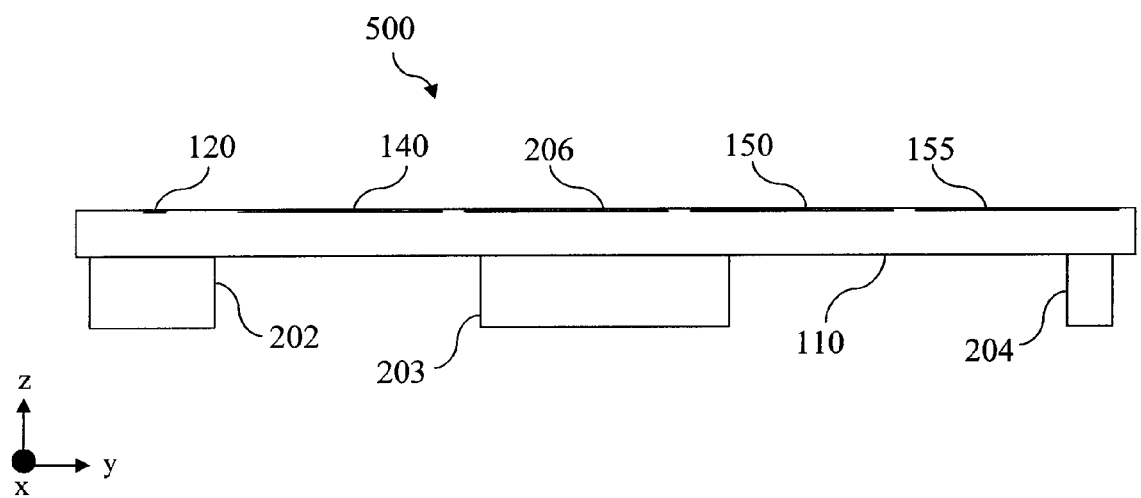
FIG. 3B is a side elevation view of the WDM transmitter comprising two TECs.

In FIG. 3B, another embodiment of a WDM transmitter 500 is illustrated. Similar to FIG. 2A, the location of several of the components of the WDM laser transmitter 500 are shown in FIG. 3B as lines on the upper surface of the carrier 110, with the understanding that though these component may appear to be extending from the surface of the carrier 110, they may in fact be embedded within the carrier 110 such that they do not extend from the surface, as in the case of PLC. These components a laser dice 120, a first channel 140, an AWG 150, and a second channel 155, which may be configure similar to the WDM transmitter 100. The WDM transmitter 500 may also comprise a component 206, which may be an active component that generates heat in addition to the heat generated by the laser dice 120. The component 206 may be one of a second laser dice 120, an amplifier, a MUX, a demultiplexer (DEMUX), or other type of component. In an embodiment, the component 206 may be passive in terms of heat generation, e.g. may not generate substantial heat in the system. In another embodiment, the component 206 may be passive but may still comprise a heat load due to exposure to other components, or to a second-order thermal effect.

As shown, the WDM transmitter 500 may comprise a second TEC 203 that may be sized appropriately to remove heat effectively from the component 206, without leading to excessive power consumption. The second TEC 203 may be located at the opposite side of the carrier 110 from the component 206, and may be aligned in proximity to the component 206. The size of the second TEC 203 may be determined by the power and area of the component 206. Thus, the second TEC 203 may provide additional thermal management for the WDM transmitter 500. The support post 204 may be arranged to provide mechanical support for the WDM transmitter 500, e.g. in areas where support is not provided by the TEC 202 and the second TEC 203 or by any other components of the WDM transmitter 500. The support post 204 may be at the opposite edge of the WDM transmitter 500 from the laser dice 102. The second TEC 203 may also provide mechanical support for the WDM transmitter 500 in the middle section of the WDM transmitter 500.

Figure 4:
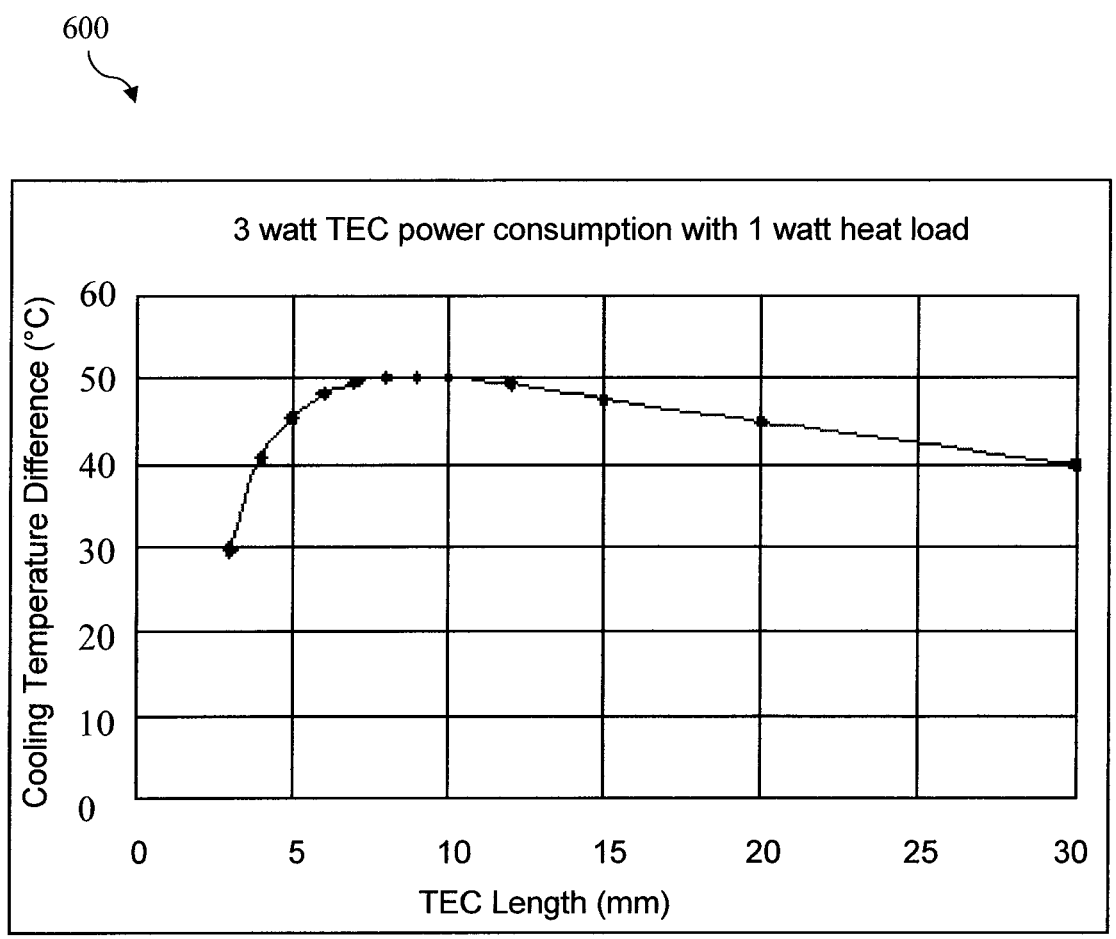
FIG. 4 is a graph of cooling efficiencies for different TECs coupled to a WDM transmitter.

FIG. 4 illustrates a graph 600 of data indicating cooling efficiencies for different TECs coupled to a carrier. The data was calculated using a carrier made of PLC (silica on silicon) backed by a copper spreader. The data may be used for selecting the appropriate length of a TEC for a carrier. For instance, a carrier (not shown) may have a length equal to about 30 millimeters (mm) and a width equal to about 8 mm. The carrier may further comprise a laser dice and an AWG on one edge. The laser dice may have a width equal to about two mm. The laser dice may comprise about four individual laser transmitters with a pitch of about 500 µm, and may be flip-bonded onto the carrier. The laser dice may be an active component of the carrier that generates heat. In FIG. 4, the data corresponds to 12 TECs having different lengths from a common point on the carrier. The lengths of the TECs range from about three mm to about thirty mm. Each TEC was coupled to the carrier and configured to remove about one watt of heat using about three watts of power. The carrier was tested with each different TEC to determine the cooling capacity using the power consumption of about three watts for about one watt of heat load.

The curve in FIG. 4 shows that maximum thermal cooling was achieved with a TEC length of about nine mm. The graph appears to be relatively flat over the range from about eight mm to about ten mm. Thus, the corresponding three TECs in the range from about eight mm to about ten mm may perform better than the remaining tested TECs, in terms of cooling efficiency.

The data provided may not be sufficient to determine which of the three TECs (e.g. corresponding to about eight mm, about nine mm, or about ten mm) may provide the most efficient cooling. However, it may be seen from the graph that the efficiency of a TEC that is about nine mm in length may be substantially higher that one of about three mm or one of about thirty mm. The data corresponding to the three mm TEC length or about thirty mm TEC length indicate that the efficiency of each is substantially lower than that of about nine mm TEC length. For instance, the TEC of about nine mm length may have a thermal efficiency that is about fifty percent higher than that of a TEC of three mm length, and a thermal efficiency that is about twenty-five percent higher than that of a TEC of thirty mm length.

If a TEC that is less than about eight mm length is used, the thermal resistance of the TEC may be higher than necessary, due to the lower number of couples N of the TEC. In this instance, additional power consumption may result, due to thermally managing the about one watt heat load with an undersized TEC. Conversely, choosing a TEC that is larger than is indicated by the graph (e.g. a TEC that is about thirty mm in length) may not provide efficient cooling since some of the cooling may be distributed to areas that do not contribute to the heat load. Such may be considered a surprising result, as TECs with more cross-sectional area are generally considered to provide greater temperature differences. Use of either an undersized TEC or an oversized TEC may reduce the overall thermal management efficiency of the PIC.

In an embodiment, additional TECs may also be used to manage the heat of passive components which may be exposed to heating that affects their operation. In another embodiment, the width of the TEC along the carrier (e.g. in the x direction of FIG. 2B) may be equal to about the width of the carrier or less than the width of the carrier. In yet another embodiment, any of the dimensions of the TEC (e.g. length, width, and/or height) may be about the same or different, based on appropriate selection criteria. In an embodiment, the system and method taught herein may be implemented with off-the-shelf components that may be commercially available.

At least one embodiment is disclosed and variations, combinations, and/or modifications of the embodiment(s) and/or features of the embodiment(s) made by a person having ordinary skill in the art are within the scope of the disclosure. Alternative embodiments that result from combining, integrating, and/or omitting features of the embodiment(s) are also within the scope of the disclosure. Where numerical ranges or limitations are expressly stated, such express ranges or limitations may be understood to include iterative ranges or limitations of like magnitude falling within the expressly stated ranges or limitations (e.g., from about 1 to about 10 includes, 2, 3, 4, etc.; greater than 0.10 includes 0.11, 0.12, 0.13, etc.). For example, whenever a numerical range with a lower limit, $R_l$, and an upper limit, $R_u$, is disclosed, any number falling within the range is specifically disclosed. In particular, the following numbers within the range are specifically disclosed: $R=R_l+k*(R_u-R_l)$, wherein k is a variable ranging from 1 percent to 100 percent with a 1 percent increment, i.e., k is 1 percent, 2 percent, 3 percent, 4 percent, 5 percent, . . . , 50 percent, 51 percent, 52 percent, . . . , 95 percent, 96 percent, 97 percent, 98 percent, 99 percent, or 100 percent. Moreover, any numerical range defined by two R numbers as defined in the above is also specifically disclosed. Use of the term "optionally" with respect to any element of a claim means that the element is required, or alternatively, the element is not required, both alternatives being within the scope of the claim. Use of broader terms such as comprises, includes, and having may be understood to provide support for narrower terms such as consisting of, consisting essentially of, and comprised substantially of. Accordingly, the scope of protection is not limited by the description set out above but is defined by the claims that follow, that scope including all equivalents of the subject matter of the claims. Each and every claim is incorporated as further disclosure into the specification and the claims are embodiment(s) of the present disclosure. The discussion of a reference in the disclosure is not an admission that it is prior art, especially any reference that has a publication date after the priority date of this application. The disclosure of all patents, patent applications, and publications cited in the disclosure are hereby incorporated by reference, to the extent that they provide exemplary, procedural, or other details supplementary to the disclosure.

While several embodiments have been provided in the present disclosure, it may be understood that the disclosed systems and methods might be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted, or not implemented.

In addition, techniques, systems, subsystems, and methods described and illustrated in the various embodiments as discrete or separate may be combined or integrated with other systems, modules, techniques, or methods without departing from the scope of the present disclosure. Other items shown or discussed as coupled or directly coupled or communicating with each other may be indirectly coupled or communicating through some interface, device, or intermediate component whether electrically, mechanically, or otherwise. Other examples of changes, substitutions, and alterations are ascertainable by one skilled in the art and may be made without departing from the spirit and scope disclosed herein.

What is claimed is:

1. An apparatus comprising:
    a carrier having a carrier length, a carrier width, and a carrier height, wherein the carrier length is greater than the carrier height, wherein the carrier width is greater than the carrier height, wherein the carrier has a first carrier surface and a second carrier surface each defined by the carrier length and the carrier width, wherein the first carrier surface is opposite the second carrier surface, and wherein the first carrier surface and the second carrier surface have a proximate end and a distal end opposite the proximate end;
    a laser array comprising a plurality of lasers coupled to the first carrier surface at the proximate end;
    a thermoelectric cooler (TEC) coupled to the second carrier surface at the proximate end such that the TEC is aligned with the laser array; and
    a support post coupled to the carrier at the distal end.

2. The apparatus of claim 1, wherein the carrier further comprises:
    an optical component coupled to the first carrier surface; and
    a second TEC coupled to the second carrier surface, wherein the second TEC has a second TEC length and a second TEC width, wherein the second TEC length is parallel to the carrier length, and wherein the second TEC width is parallel to the carrier width,
    wherein the second TEC length is less than the carrier length, and
    wherein the second TEC is aligned with the optical component.

3. The apparatus of claim 2, wherein the second TEC is positioned between the TEC and the support post, wherein the support post has a support post length and a support post width, wherein the support post length is parallel to the carrier length, wherein the support post width is parallel to the carrier width, and wherein the carrier length is greater than a sum of the TEC length, the second TEC length, and the support post length.

4. The apparatus of claim 1, wherein the support post has a higher thermal resistivity than the TEC, and wherein the support post is hollow.

5. The apparatus of claim 1, wherein the support post has a higher thermal resistivity than the TEC, and wherein the support post is solid.

6. The apparatus of claim 1, wherein the carrier comprises an arrayed waveguide grating (AWG) positioned on the first carrier surface and coupled to the laser array wherein neither the TEC nor the second TEC is aligned with the AWG, and wherein the apparatus does not comprise any other TECs aligned with the AWG.

7. The apparatus of claim 6 further comprising:
    a second laser array comprising a plurality of second lasers coupled to the first carrier surface; and
    a second thermoelectric cooler (TEC) coupled to the second carrier surface and aligned with the second laser array, wherein the second TEC has a second TEC length and a second TEC width, wherein the second TEC length is parallel to the carrier length, and wherein the second TEC width is parallel to the carrier width,
    wherein the second TEC length is less than the carrier length,
    wherein the second TEC width is less than the carrier width, wherein the TEC is not aligned with the second laser array, and wherein the second TEC is not aligned with the laser array.

8. The apparatus of claim 1, wherein the TEC has a TEC length and a TEC width, wherein the TEC length is parallel to the carrier length, and wherein the TEC width is parallel to the carrier width, wherein the TEC length is less than the carrier length, wherein the TEC width is less than the carrier width, and wherein the support post is coupled to the second carrier surface.

9. The apparatus of claim 8, wherein the laser array is positioned within a single laser die having a laser die length and a laser die width, wherein the laser die length is parallel to the carrier length, wherein the laser die width is parallel to the carrier width, wherein the TEC length is greater than the laser die length, and wherein the TEC width is greater than the laser die width.

10. The apparatus of claim 9, wherein the lasers are coupled to a plurality of heaters, and wherein the TEC is aligned with the heaters.

11. The apparatus of claim 8, wherein the support post has a support post length and a support post width, wherein the support post length is parallel to the carrier length, wherein the support post width is parallel to the carrier width, and wherein the carrier length is greater than a sum of the TEC length and the support post length.

12. The apparatus of claim 11, wherein the carrier width is greater than the support post width.

13. The apparatus of claim 1, wherein the apparatus comprises only one TEC aligned with the laser array.

14. An apparatus comprising:
a carrier having a carrier length, a carrier width, and a carrier height, wherein the carrier length is greater than the carrier height, wherein the carrier width is greater than the carrier height, wherein the carrier has a first carrier surface and a second carrier surface each defined by the carrier length and the carrier width, wherein the first carrier surface is opposite the second carrier surface, and wherein the carrier comprises:
a first laser die comprising a plurality of first optical transmitters on the first carrier surface; and
a second laser die comprising a plurality of second optical transmitters on the first carrier surface;
a first thermoelectric cooler (TEC) coupled to the second carrier surface and aligned with the first laser die; and
a second TEC coupled to the second carrier surface and aligned with the second laser die.

15. The apparatus of claim 14 further comprising:
a support post coupled to the second carrier surface,
wherein the carrier has a first end and a second end opposite the first end,
wherein the first laser die, the second laser die, the first TEC, and the second TEC are located at the first end of the carrier, and
wherein the support post is located at the second end of the carrier.

16. The apparatus of claim 15, wherein the first TEC has a first TEC length and a first TEC width, wherein the first TEC length is parallel to the carrier length, wherein the first TEC width is parallel to the carrier width, wherein the second TEC has a second TEC length and a second TEC width, wherein the second TEC length is parallel to the carrier length, wherein the second TEC width is parallel to the carrier width, wherein the support post has a support post length and a support post width, wherein the support post length is parallel to the carrier length, wherein the support post width is parallel to the carrier width, and wherein the first TEC length is less than the carrier length, and wherein the second TEC length is less than the carrier length.

17. The apparatus of claim 15, wherein the first TEC is not aligned with the second laser die, and wherein the second TEC is not aligned with the first laser die.

18. The apparatus of claim 17 further comprising an arrayed waveguide grating (AWG) on the first carrier surface and coupled to the first laser die and the second laser die, wherein neither the first TEC nor the second TEC is aligned with the AWG, and wherein the apparatus does not comprise any other TECs aligned with the AWG.

19. The apparatus of claim 18, wherein the support post has a higher thermal resistivity than the first TEC and the second TEC.

20. An apparatus comprising:
a carrier comprising a heat-generating component;
a thermoelectric cooler (TEC) coupled to a surface of the carrier; and
a support post coupled to the surface of the carrier,
wherein the support post has a higher thermal resistivity and a smaller cross-sectional area than the TEC,
wherein the cross-sectional area of the TEC is less than the cross-sectional area of the carrier,
wherein the TEC is aligned with the heat-generating component, and
wherein the support post is not aligned with the heat-generating component and is not adjacent to the TEC.

* * * * *